United States Patent

Asao et al.

(10) Patent No.: US 10,285,286 B2
(45) Date of Patent: May 7, 2019

(54) ELECTRONIC CONTROL DEVICE AND METHOD OF MANUFACTURING SAME, AND ELECTRIC POWER STEERING CONTROL DEVICE

(71) Applicant: Mitsubishi Electric Corporation, Tokyo (JP)

(72) Inventors: Yoshihito Asao, Tokyo (JP); Akihiko Mori, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 448 days.

(21) Appl. No.: 14/906,717

(22) PCT Filed: Oct. 4, 2013

(86) PCT No.: PCT/JP2013/077098
§ 371 (c)(1),
(2) Date: Jan. 21, 2016

(87) PCT Pub. No.: WO2015/049791
PCT Pub. Date: Apr. 9, 2015

(65) Prior Publication Data
US 2016/0174393 A1 Jun. 16, 2016

(51) Int. Cl.
*H02K 5/00* (2006.01)
*H02K 7/14* (2006.01)
(Continued)

(52) U.S. Cl.
CPC ......... *H05K 5/0069* (2013.01); *B62D 5/0406* (2013.01); *B62D 5/0463* (2013.01);
(Continued)

(58) Field of Classification Search
CPC .... H02K 11/33; H05K 5/0017; H05K 5/0069; H05K 7/1432
(Continued)

(56) References Cited

U.S. PATENT DOCUMENTS 5,770,902 A * 6/1998 Batten ............ H02K 5/225
310/68 D
6,494,723 B2 * 12/2002 Yamane .......... B60R 16/0238
439/404
(Continued)

FOREIGN PATENT DOCUMENTS

CN 101384145 A 3/2009
EP 2824807 A1 1/2015
(Continued)

OTHER PUBLICATIONS

Communication dated May 18, 2017, issued from the Europe Patent Office in the corresponding European Patent Application No. 13895114.0.
(Continued)

*Primary Examiner* — Joseph M Rocca
*Assistant Examiner* — Maurice L Williams
(74) *Attorney, Agent, or Firm* — Sughrue Mion, PLLC; Richard C. Turner (57) ABSTRACT

Provided is an electronic control device, including: a connector case; two or more connectors including a power supply connector and another connector, the connectors being mounted to an external side of the case; a control unit mounted to an inner side of the case; and a power supply circuit unit including circuit components mounted to the external side of the case, the connectors being mounted apart from each other. The another connector is connected to the control unit by passing through the case not via the power supply circuit unit. The power supply circuit unit includes power supply conducting bars adjacent to each other on an inner side of the case. The power supply conducting bars are connected to the circuit components and the power supply connector by passing through the case and are also connected to the control unit.

17 Claims, 4 Drawing Sheets

(51) Int. Cl.
*H02K 11/33* (2016.01)
*B62D 5/04* (2006.01)
*H05K 5/00* (2006.01)
*H05K 7/14* (2006.01)

(52) U.S. Cl.
CPC .......... *H02K 11/33* (2016.01); *H05K 5/0017* (2013.01); *H05K 7/1432* (2013.01)

(58) Field of Classification Search
USPC .................................... 361/679.01, 728–730
See application file for complete search history.

(56) References Cited

U.S. PATENT DOCUMENTS

| | | | | |
|---|---|---|---|---|
| 6,547,572 | B1* | 4/2003 | Burdick | B60R 16/0238 439/76.2 |
| 6,906,483 | B2* | 6/2005 | Tominaga | B62D 5/0406 318/280 |
| 7,621,367 | B2* | 11/2009 | Tominaga | B62D 5/0406 180/444 |
| 7,946,878 | B2* | 5/2011 | Lang | H01R 9/2458 439/404 |
| 2003/0127921 | A1* | 7/2003 | Akutsu | B62D 5/0406 310/68 R |
| 2005/0001702 | A1* | 1/2005 | Norton | F01L 3/08 335/220 |
| 2008/0244484 | A1* | 10/2008 | Kumazaki | G06F 17/5022 716/106 |
| 2009/0035964 | A1* | 2/2009 | Yamamoto | H01R 12/58 439/79 |
| 2011/0226524 | A1 | 9/2011 | Hagiwara et al. | |
| 2012/0129372 | A1* | 5/2012 | Le Page | H01R 13/70 439/246 |
| 2013/0249335 | A1 | 9/2013 | Motoda | |
| 2013/0286563 | A1* | 10/2013 | Kaneko | H05K 7/00 361/679.01 |
| 2013/0313929 | A1* | 11/2013 | Naka | H02K 5/18 310/64 |
| 2014/0105767 | A1* | 4/2014 | Iwabuchi | H05K 7/00 417/410.1 |

FOREIGN PATENT DOCUMENTS

| | | |
|---|---|---|
| JP | 2009-064916 A | 3/2009 |
| JP | 2009-64916 A | 3/2009 |
| JP | 2010-288328 A | 12/2010 |
| JP | 5174071 B2 | 4/2013 |
| JP | 2013-106376 A | 5/2013 |
| JP | 2013-141969 A | 7/2013 |
| WO | 03/001647 A1 | 1/2003 |
| WO | 2013/132584 A1 | 9/2013 |

OTHER PUBLICATIONS

Communication dated Dec. 28, 2016, from the State Intellectual Property Office of People's Republic of China in counterpart Application No. 201380080040.5.
International Search Report of PCT/JP2013/077098 dated Nov. 26, 2013.

* cited by examiner

ELECTRONIC CONTROL DEVICE AND METHOD OF MANUFACTURING SAME, AND ELECTRIC POWER STEERING CONTROL DEVICE

CROSS REFERENCE TO RELATED APPLICATIONS

This application is a National Stage of International Application No. PCT/JP2013/077098 filed Oct. 4, 2013, the contents of all of which is incorporated herein by reference in its entirety.

TECHNICAL FIELD

The present invention relates to an electronic control device, and more particularly, to an electronic control device and the like including a plurality of connectors and electronic circuits.

BACKGROUND ART

Hitherto, among electronic control devices, a vehicle electronic control device, for example, has mounted thereon a plurality of connectors having many terminals in order to contain an electronic circuit having many electronic components mounted thereon, or to introduce into the control device a power supply line, a ground line, and various signal lines from the vehicle side. There is a constant need to reduce the size and weight of the control device in order to mount the control device in the vehicle, and various improvements have been made.

For example, a device disclosed in Patent Literature 1 is reduced in size by integrating an actuator (motor) with a control unit. In particular, the control unit portion includes a connector, a unit cover, and a laminated structure in which a first substrate for power output, a second substrate for connecting a third substrate to the first substrate, and a third substrate for a CPU are laminated in order from a side closer to the connector in the unit cover. Regarding the flow of electricity, electric power (power supply, ground line) is input via the connector from a battery mounted in the vehicle. A noise filter coil, a capacitor, and the like are mounted to the second substrate past the first substrate, and an FET element, which is a switching element, and the like are mounted to the first substrate.

Further, a device disclosed in Patent Literature 2 has a structure in which a capacitor is directly connected and mounted to the connection terminals (terminals) of the connector between the connector and the circuit board.

CITATION LIST

Patent Literature

[PTL 1] JP 2013-106376 A
[PTL 2] JP 5174071 B2

SUMMARY OF INVENTION

Technical Problem

However, with the structure of Patent Literature 1, the path of the power supply system is not the shortest course. As a result, when the path is long, it is disadvantageous in terms of noise generation and mounting surface area. Therefore, there is still room for improvement of the structure of Patent Literature 1. Further, although the structure of Patent Literature 2 can be applied if the capacitor element is small enough to be inserted between the connection terminals, for the comparatively larger coil element, capacitor element, and the like such as in Patent Literature 1, the structure of Patent Literature 2 cannot be applied.

It is an object of the present invention to improve on the above-mentioned problems of related-art devices and provide an electronic control device and the like that are compact and can reduce noise.

Solution to Problem

According to one embodiment of the present invention, there is provided an electronic control device, including: a connector case; two or more connectors including a power supply connector and another connector, the two or more connectors being mounted to an external side of the connector case; a control unit mounted to an inner side of the connector case; and a power supply circuit unit including circuit components mounted to the external side of the connector case, the power supply connector and the another connector being mounted apart from each other, the another connector being connected to the control unit by passing through the connector case not via the power supply circuit unit, the power supply circuit unit including power supply conducting bars adjacent to each other on an inner side of the connector case, the power supply conducting bars being connected to the circuit components and the power supply connector by passing through the connector case and also being connected to the control unit.

Advantageous Effects of Invention

According to the one embodiment of the present invention, a structure can be provided that can shorten the path from the connectors to the circuit portion, and that is not only compact, but is also resistant to noise when components are mounted on the path.

DESCRIPTION OF EMBODIMENTS

A description is now given of an electronic control device and the like according to each embodiment of the present invention referring to the accompanying drawings, and in each embodiment, like or corresponding components are denoted by like reference symbols and overlapping descriptions thereof are omitted.

Further, although in the following description, an electric power steering control device for a vehicle is described as an example of the electronic control device, the present invention is not limited to an electric power steering control device. The present invention may be employed in any electronic control device having a similar configuration.

First Embodiment

Figure 1:
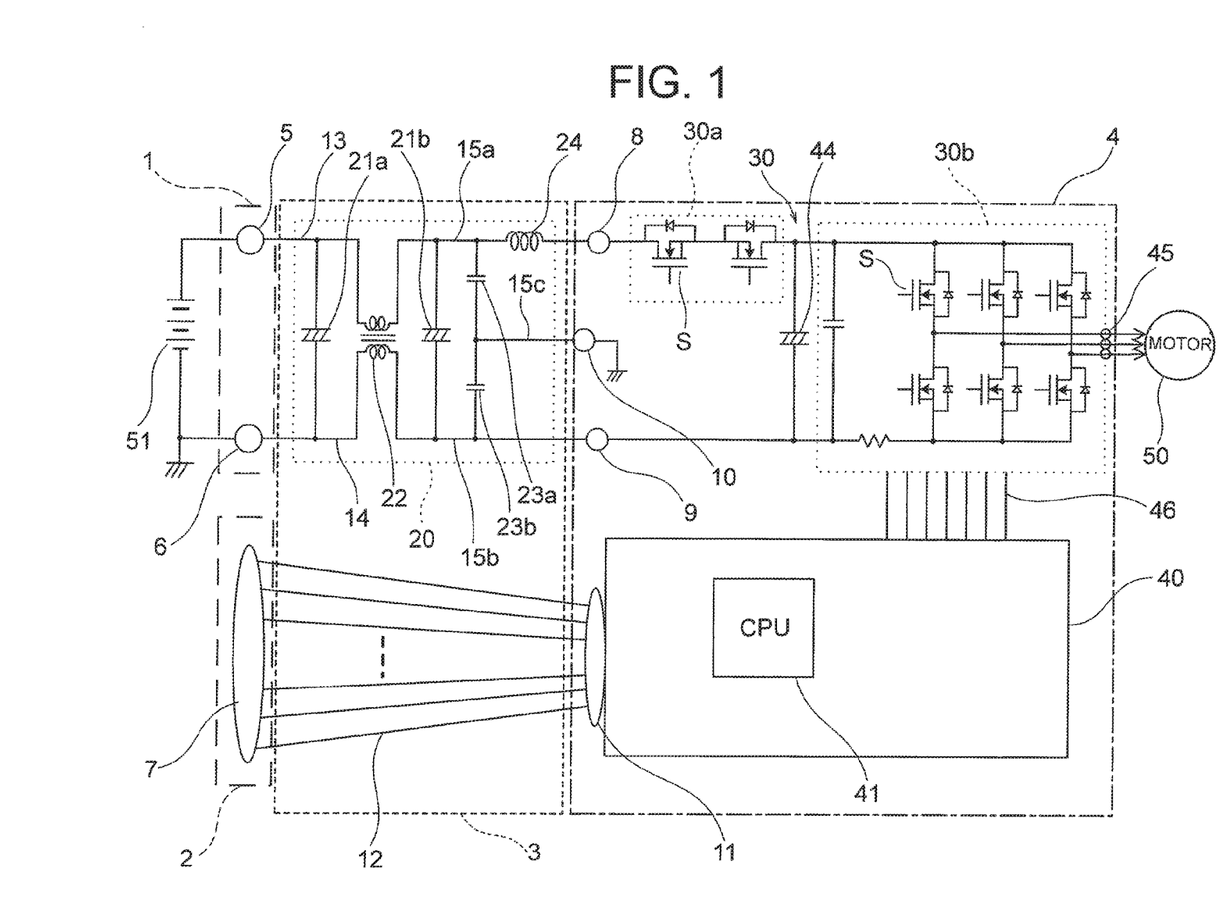
FIG. 1 is a circuit diagram for illustrating an example of a configuration of an overall circuit of an electric power steering control device employing an electronic control device according to the present invention.

FIG. 1 is a circuit diagram for illustrating an example of a configuration of an overall circuit of an electric power steering control device employing an electronic control device according to the present invention. The electronic control device includes a power supply connector 1, signal connectors (other connectors) 2, a connector case 3, and a control unit 4. The electronic control device illustrated in FIG. 1, which is integral with a motor 50, is configured to act as an electric power steering control device that causes the motor 50 to produce steering assistance torque. The power supply connector 1 includes first power supply terminals 5 and 6 configured to supply electric power via a cable from positive and negative terminals of a battery 51. Further, the signal connectors 2, which are for signal lines, include a large number of first signal terminals 7 into which various signals from the vehicle side, such as a vehicle speed signal, a steering torque signal, and the like, are input.

The power supply connector 1 and the signal connectors 2 are integral with the connector case 3. Details of the configuration of those parts are described with reference to the drawings from FIG. 2 onwards. A power supply circuit unit 20 is arranged in an internal section of the connector case 3. The power supply circuit unit 20 includes power supply conducting bars 13, 14, 15a, 15b, and 15c that extend from the first power supply terminals 5 and 6 of the power supply connector 1. Various circuit components are connected and mounted to a positive conducting bar 13 and a negative conducting bar 14 that extend from the first power supply terminals 5 and 6. Representative examples of such circuit components include electrolytic capacitors 21a and 21b, a transformer 22, film capacitors 23a and 23b, and a coil 24, which are each illustrated in FIG. 1. The power supply line is next connected via those circuit components to a drive circuit unit 30 included in the control unit 4.

Second power supply terminals 8, 9, and 10 are arranged on the power supply line at an entrance to the drive circuit unit 30, which includes a first drive circuit 30a and a second drive circuit 30b. The terminal 8 is a positive power supply, the terminal 9 is a negative power supply, and the terminal 10 is, for example, a body earth terminal (ground terminal) connected to the body of the motor 50. Note that, if the control unit 4 includes a metal portion electrically connected to the body earth, the terminal 10 may be connected to the control unit 4. The drive circuit 30a has, for example, an electronic relay function. If the motor 50 is a brushless three-phase winding motor, as illustrated in FIG. 1, the drive circuit 30b is configured from an inverter circuit having a total of six switching elements S. The six switching elements S are arranged so that three series circuits, each series circuit consisting of two switching elements S connected in series, are connected in parallel. A line for supplying current to the motor 50 extends from each of the connection points between the switching elements of each series circuit of the drive circuit 30b. The winding end of the motor 50 and the drive circuit 30b are connected by terminals 45. Note that, other electronic components 44 and the like are also connected to the drive circuit unit 30.

On the other hand, signal conducting bars 12 directly extend from the first signal terminals 7 to second signal terminals 11, without any circuit components being mounted to the signal conducting bars 12. The terminals 11 are arranged at the entrance to a control board 40, which is included in the control unit 4 together with the drive circuits 30a and 30b, and which has a central processing unit (CPU) 41 mounted thereon. The CPU 41 mounted to the control board 40 is configured to perform control by receiving various types of information from the signal lines, namely, the signal conducting bars 12, computing control signals for controlling the motor 50, and outputting the computed control signals to the drive circuits 30a and 30b. Specifically, for example, the CPU 41 performs ON/OFF control of the switching elements S in the drive circuits 30a and 30b. The control signals are transmitted to the drive circuits 30a and 30b via connection terminals 46. The power supply and the ground of the control board 40 may be supplied by diverting power from the second power supply terminals 8 and 9, or, may be separately supplied from the first signal terminals 7 and the signal conducting bars 12. Note that, the control unit 4 has the same configuration as a related-art device, and hence a detailed description thereof is omitted here.

Figure 2:
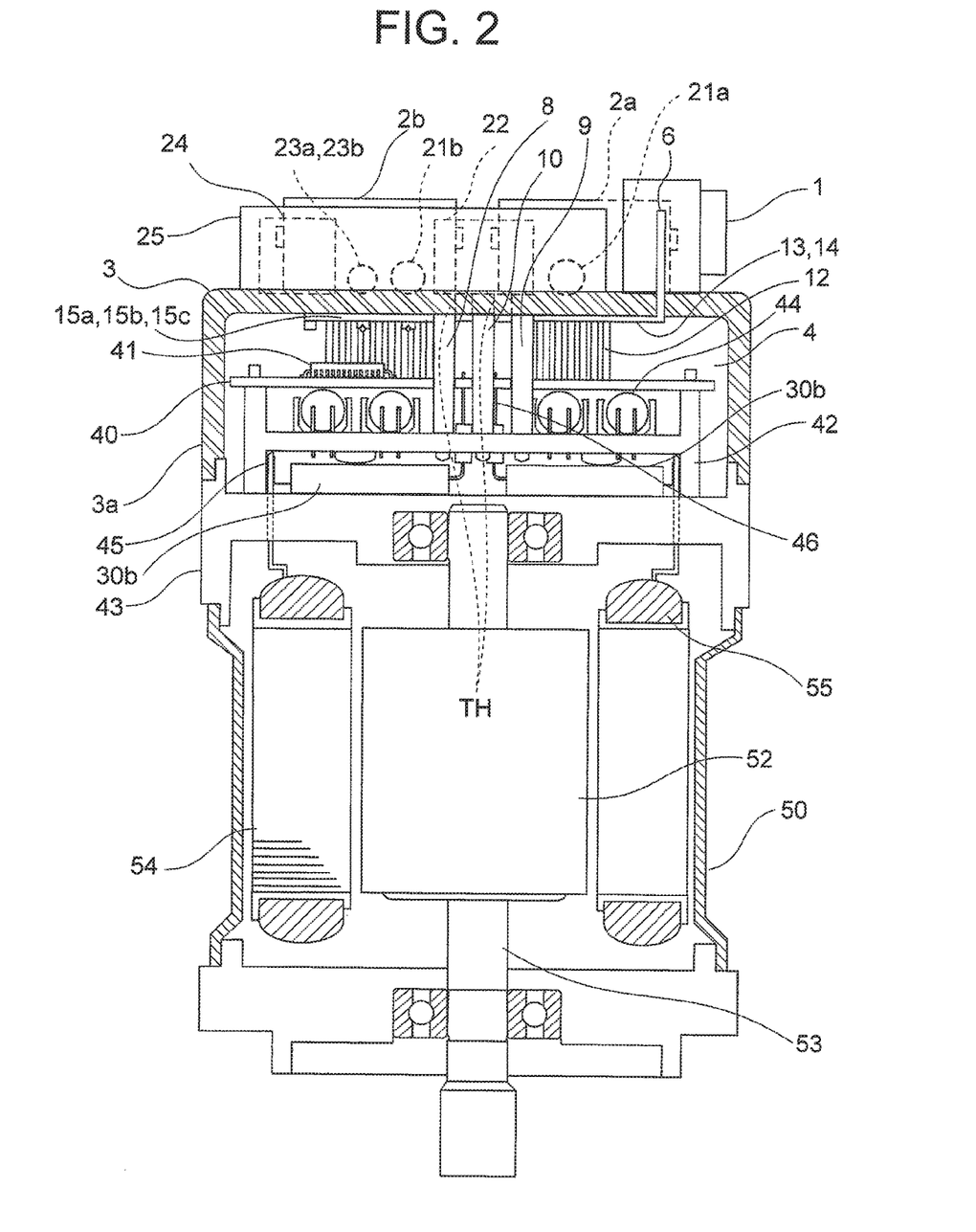
FIG. 2 is a cross-sectional view of an electric power steering control device according to a first embodiment of the present invention.

Next, the structure of the electronic control device according to the present invention is described with reference to the drawings from FIG. 2 onwards. FIG. 2 is a cross-sectional view (including a side view portion and a perspective view portion at an upper part thereof) of an electric power steering control device according to the first embodiment of the present invention. As illustrated in FIG. 2, the electronic control device is mounted to one end portion (the upper portion in FIG. 2) of the motor 50. In this structure, the control unit 4 is arranged between the connector case 3 having the power supply connector 1 and signal connectors 2a and 2b mounted on the external side thereof, and a motor cover 43. On the other hand, similarly to a related-art motor, the motor 50 is configured from a rotor 52, which is configured to rotate together with an output shaft 53, and a stator 54, which is arranged to surround the rotor 52 and includes a winding 55 wound thereon.

More specifically, the connector case 3 is configured from an upper surface member and a side surface member. The upper surface member is integral with the power supply connector 1 including the power supply terminals 5 and 6 (in FIG. 2, only terminal 6 is shown), and the two signal connectors 2a and 2b, which each include a plurality of signal terminals 7 (refer to FIG. 1 and FIG. 3). The side surface member extends once around the periphery of the upper surface member. The upper surface member and the side surface member form a wall portion 3a, which encloses the upper surface and the peripheral side surface of the control unit 4.

Further, the power supply circuit unit 20 is mounted in a power supply cover 25 near each of the connectors 1, 2a, and 2b. The power supply circuit unit 20 includes, for example, the electrolytic capacitors 21a and 21b, the transformer 22, the film capacitors 23a and 23b, and the coil 24, which are illustrated in FIG. 1.

Figure 3:
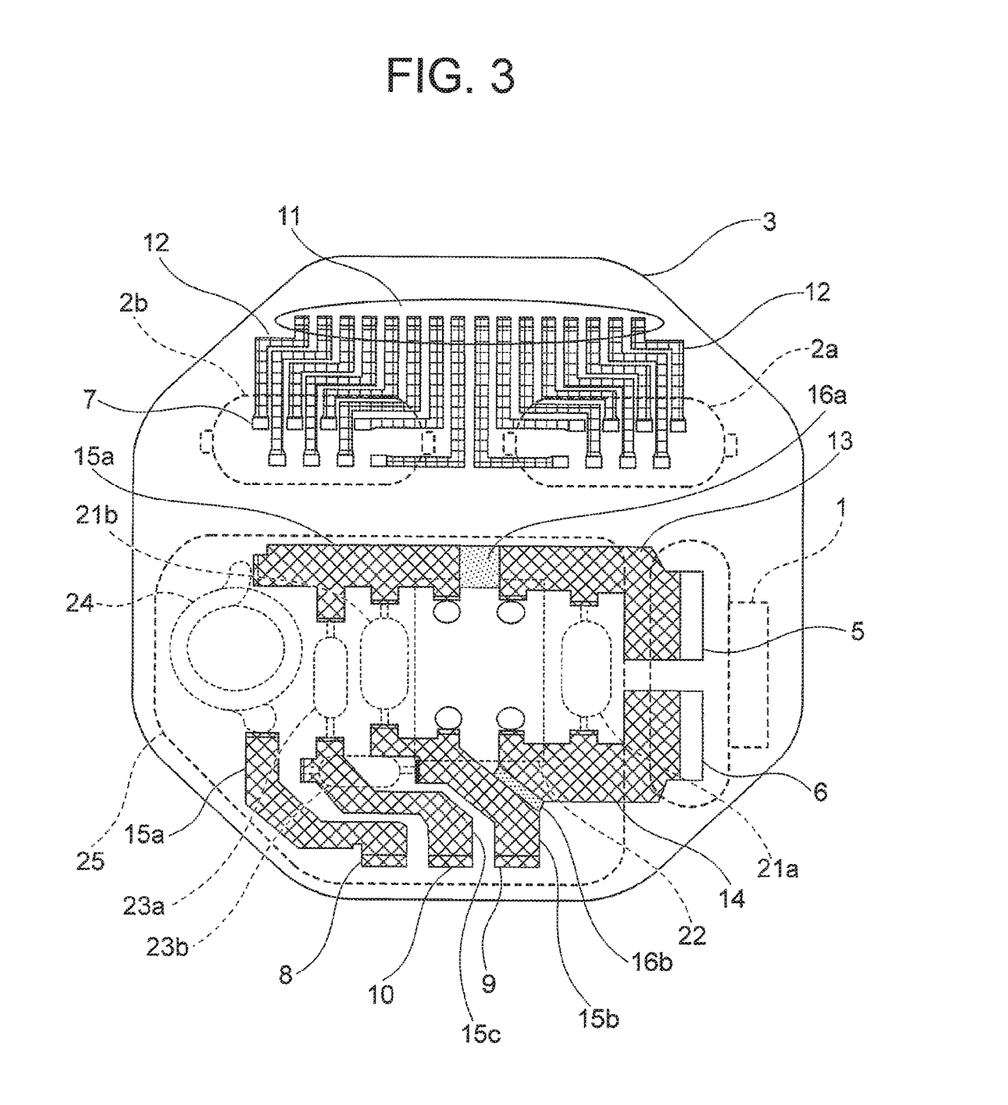
FIG. 3 is a perspective view of the electric power steering control device illustrated in FIG. 2 as seen from above in FIG. 2.

The power supply terminals 5 and 6 of the power supply connector 1 pass through the connector case 3 to reach the positive power supply conducting bar 13 and the negative power supply conducting bar 14 (refer to FIG. 3). Further, the plurality of signal terminals 7 pass through the connector case 3 to reach a corresponding signal conducting bar 12 (refer to FIG. 3). In FIG. 2, the terminal 6 is representatively shown as passing through the connector case 3 and extending therefrom. Further, the electrolytic capacitors 21a and 21b, the transformer 22, the film capacitors 23a and 23b, and the coil 24 included in the power supply circuit unit 20 pass through the connector case 3 and are connected to a predetermined position of the power supply conducting bars 13, 14, 15a, 15b, and 15c (refer to FIG. 3). In FIG. 2, a through-hole TH formed in the connector case 3 for the transformer 22 is representatively indicated by the dotted line.

The control unit 4 includes a relay member 42 placed in a stacked shape between the control board 40 having the CPU 41 mounted thereon and the second drive circuit 30b (the first drive circuit 30a is arranged on the far side of the second drive circuit 30b, and hence is not shown in FIG. 2). The relay member 42 is an insulating structural component that includes connection terminals 46 and the like between the other electronic components 44, the control board 40, and the drive circuit 30b. Further, a conducting bar having a structure for supporting the control board 40 and the like is wrapped around the relay member 42. The main surface of the drive circuit 30b abuts the motor cover 43 in order to release heat. Therefore, the motor cover 43 is made of aluminum, for example, and has a predetermined thickness. In addition, the motor cover 43 also acts as a cover of the lower surface side of the control unit 4. An end portion of the winding 55 of the motor 50 passes through the motor cover 43, extends toward the control unit 4, and is connected to the drive circuit 30b by the terminal 45.

Next, FIG. 3 is a perspective view of the electric power steering control device illustrated in FIG. 2 as seen from above in FIG. 2 through the connector case 3, the connectors 1, 2a, and 2b, and the power supply cover 25. The power supply connector 1 and the signal connectors 2a and 2b are arranged apart from each other on the external side of the upper surface member corresponding to the lid of the connector case 3. At the signal connectors 2a and 2b, the respective signal conducting bars 12 first extend from the plurality of terminals 7 in a direction parallel to the surface of the upper surface member of the connector case 3 toward the outer periphery side of the connector case 3, and then extend toward the back side of the page surface in FIG. 3 (the control board 40 direction in FIG. 2). The distal end of each of the signal conducting bars 12 is connected to a corresponding second signal terminal 11 (not shown in FIG. 3) of the control board 40. Note that, because there are as many as sixteen signal lines, the connectors are divided into two. However, it is also acceptable to employ only one signal connector.

The power supply connector 1 is arranged on a part of an outer periphery side of the connector case 3 such that the positive power supply terminal 5 and the negative power supply terminal 6 are in an erect state on the external side of the connector case 3. The power supply conducting bars 13, 14, 15a, 15b, and 15c described below extend in the direction parallel to the surface of the upper surface member of the connector case 3. The power supply conducting bar 13 extends from the positive power supply terminal 5. Similarly, the power supply conducting bar 14 extends from the negative power supply terminal 6. The electrolytic capacitor 21a and a primary side terminal of the transformer 22 are connected across the power supply conducting bars 13 and 14.

The positive power supply conducting bar 15a extends from one of the terminals on a secondary side of the transformer 22, and is connected to one of the terminals of each of the electrolytic capacitor 21b, the film capacitor 23a, and the coil 24. Further, another positive power supply conducting bar 15a extends from another terminal of the coil 24 toward the outer periphery side of the connector case 3, is bent at the outer periphery side, and further extends as the positive power supply terminal 8 toward the back side of the page surface in FIG. 3 (terminal 8 in FIG. 2).

The negative power supply conducting bar 15b extends from another terminal on the secondary side of the transformer 22, is connected to another terminal of the electrolytic capacitor 21b and one of the terminals of the film capacitor 23b, extends toward the outer periphery side of the connector case 3, is bent at the outer periphery side, and further extends as the negative power supply terminal 9 toward the back side of the page surface in FIG. 3 (terminal 9 in FIG. 2). Further, the body earth power supply conducting bar 15c is connected to another terminal of the film capacitor 23a and another terminal of the film capacitor 23b, extends toward the outer periphery side of the connector case 3, is bent at the outer periphery side, and further extends as the body earth power supply terminal 10 toward the back side of the page surface in FIG. 3 (terminal 10 in FIG. 2). The terminals 8, 9, and 10 at the distal ends of the conducting bars are bent and extend toward the back side of the page surface in FIG. 3 (the terminals 8, 9, and 10 in FIG. 2), and are connected to the drive circuit 30b via the relay member 42.

Next, the parts are described according to the order in which the parts are constructed. First, the connector case 3 is integrally formed with each of the connectors 1, 2a, and 2b. At this stage, the terminals 5, 6, and 7 and the conducting bars 12, 13, 14, 15a, 15b, and 15c are formed by insert molding or outsert molding. As a result, the conducting bars 12, 13, 14, 15a, 15b, and 15c are arranged on an inner side of the connector case 3 as illustrated in FIG. 2 (e.g., on the back surface of the upper surface member of the connector case 3), or inside the connector case. Note that, the terminals 5, 6, 8, 9, and 10 and the conducting bars 13, 14, 15a, 15b, and 15c may be formed integrally. Further, the terminal 7 and the signal conducting bars 12 may also be formed integrally.

Next, each of the circuit components (21a, 21b, 22, 23a, 23b, and 24) of the power supply circuit unit 20 is mounted on the external upper surface of the connector case 3. During this process, the connection terminals (not shown) of each of the circuit components are made to pass through through-holes (the through-hole TH for the transformer 22 representatively illustrated in FIG. 2 is indicated by the dotted line) formed in advance in the connector case 3, and protrude into the inner side of the connector case 3. Each of the connection terminals extends toward the control unit 4 illustrated in FIG. 2, and a predetermined end portion (terminal) of the control unit 4 is connected by welding or soldering to the end portion of each connection terminal. In other words, all of the circuit components are arranged in the same direction so that each of the circuit components (21a, 21b, 22, 23a, 23b, and 24) of the power supply circuit unit 20 can be arranged in an erect state (upright state) on the external side of the connector case 3, and the connection terminals of each of the circuit components can pass through the connector case 3, extend into the inner side of the connector case 3, and connect to a predetermined end portion of a corresponding conducting bar (13, 14, 15a, 15b, and 15c). As a result, construction properties improve because all of the connections between the connection terminals of each of the circuit components and the end portions (terminals) of the conducting bars can be carried out on the inner side of the connector case 3.

After the connection terminals have been connected, the connector case 3 is complete, and hence the power supply cover 25 is fixed so as to cover each of the circuit components (21a, 21b, 22, 23a, 23b, and 24) of the power supply circuit unit 20. In this state, the control unit 4 is fitted to the inner side of the connector case 3 by connecting and fixing the signal conducting bars 12 and the terminals 8, 9, and 10 protruding from the conducting bars (12, 13, 14, 15a, 15b, and 15c) on the inner side of the connector case 3 to predetermined terminals of the control board 40 and the relay member 42 of the control unit 4 via through-holes (not shown) formed in advance, for example.

Thus, the power supply connector 1 and the signal connectors 2a and 2b are arranged apart from each other, and each of the signal conducting bars 12 extending toward the control unit 4 is arranged on one outer periphery side of the connector case 3. The power supply circuit unit 20 is arranged adjacent to the power supply connector 1, and the power supply circuit unit 20 and the power supply connector 1 are connected by the conducting bars (13, 14, 15a, 15b, and 15c) including the connections of the circuit components inside the power supply circuit unit 20. The second power supply terminals 8, 9, and 10 to the drive circuit unit 30 (particularly, the drive circuit 30b) are arranged on another outer periphery side of the connector case 3 separated from the signal conducting bars 12. As a result, the power supply system and the signal system are separated, which enables the possibility of noise from the power supply system affecting the signal system to be reduced. Further, in the same planar region of the connector case 3, the power supply terminals 8, 9, and 10 are arranged in a direction roughly orthogonal to or orthogonal to the power supply terminals 5 and 6 of the power supply connector 1, and the circuit components of the power supply circuit unit 20 are arranged close together on the external side of the connector case 3 so as not to be included in the control unit 4, and hence the size of the electronic control device can be reduced.

Further, because the conducting bars 13, 14, 15a, 15b, and 15c are arranged roughly parallel or in parallel to each other without overlapping in the same plane, there is little noise produced from the lines to the outside. In addition, as illustrated in FIG. 3, the conducting bars 13, 14, 15a, 15b, and 15c can be manufactured from one conducting bar by cutting away unnecessary portions (in FIG. 3, unnecessary portions 16a, 16b, etc.). Still further, the connection end portions (terminals) of the conducting bars 13, 14, 15a, 15b, and 15c with each of the circuit components of the power supply circuit unit 20 also all extend in the same direction on the back surface side of the connector case 3 in FIG. 3. Those conducting bars 13, 14, 15a, 15b, and 15c have a shape that can be easily manufactured.

Further, in the circuit illustrated in FIG. 1, for example, when the transformer 22 is not required, the transformer 22 illustrated in FIG. 3 is not mounted. In that case, there is an advantageous effect that conducting bars from which the above-mentioned unnecessary portions 16a and 16b have not been cut away may be used for the conducting bars 13, 14, 15a, 15b, and 15c, and the other circuit components can also serve a dual purpose.

Second Embodiment

Figure 4:
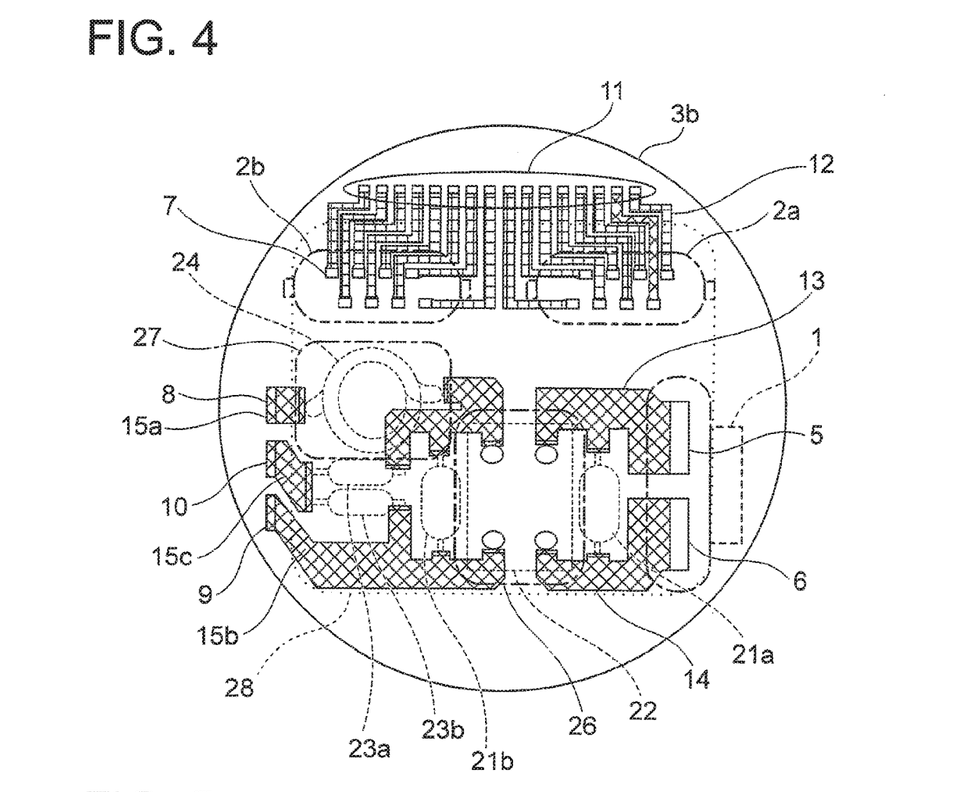
FIG. 4 is a perspective view of a connector case of an electric power steering control device according to a second embodiment of the present invention as seen from above.
Figure 5:
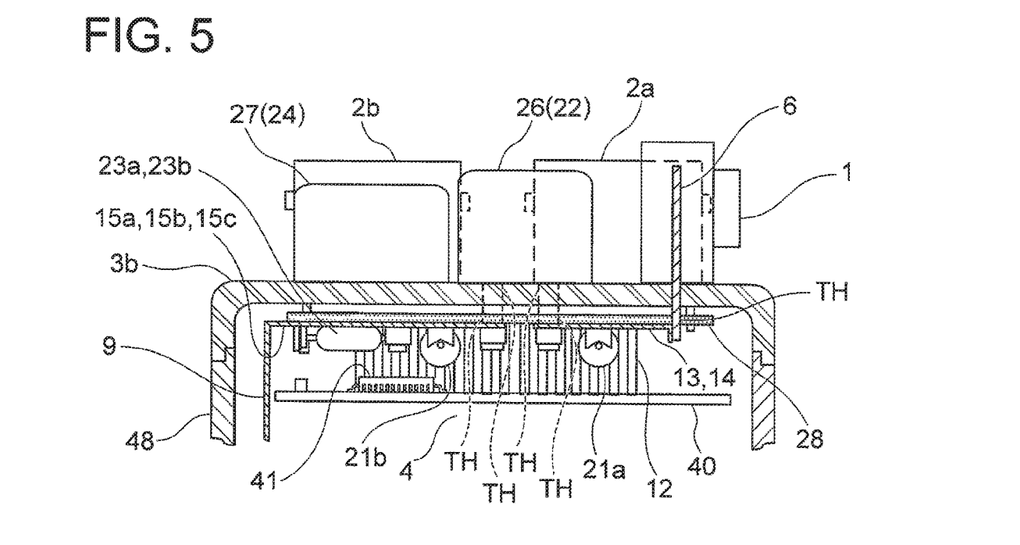
FIG. 5 is a partial cross-sectional view of the connector case illustrated in FIG. 4.

FIG. 4 is a perspective view of a connector case of an electric power steering control device according to a second embodiment of the present invention as seen from above. FIG. 5 is a partial cross-sectional view (including a side view portion and a perspective view portion at an upper part thereof) of the connector case illustrated in FIG. 4. Note that, the portion below the portion illustrated in FIG. 5 is basically the same as in FIG. 2.

A connector case 3b illustrated in FIG. 4 has a lid shape having a lower height than the connector case 3 according to the embodiment described above. Therefore, in order to ensure a space to house the control unit 4, a housing 48 for extending the connector case 3b in a downward direction is arranged as a separate member. Further, the arrangement of the second power supply terminals 8, 9, and 10 is different. The second power supply terminals 8, 9, and 10 are arranged on a part of the outer periphery side of the connector case 3b so as to face the first power supply terminals 5 and 6 of the power supply connector 1 in the same planar region. In addition, the connector case 3b has a circular shape having a diameter that is about the same length as the diameter of the motor 50. As a result, the diameter of the whole device is uniform, which has the advantageous effect that the whole device also looks slimmer.

Similarly to FIG. 3, the positive power supply conducting bars 13 and 15a, the negative power supply conducting bars 14 and 15b, and the earth power supply conducting bar 15c are arranged in parallel to each other without overlapping in the same plane. However, the cover of the circuit components of the power supply circuit unit is divided into a transformer cover 26 and a coil cover 27 for the transformer 22 and the coil 24, respectively, and is hence more compact. Similarly to the above-mentioned embodiment, the power supply connector 1, the conducting bars 13, 14, 15a, 15b, and 15c, and the power supply terminals 8, 9, and 10 are arranged apart from the signal connectors 2a and 2b and the signal conducting bars 12. The conducting bars 15a, 15b, and 15c and the terminals 8, 9, and 10 are formed into a shape so that the wires connect the terminals at both ends in the shortest distance in a comparatively straight line and as parallel as possible. The conducting bars 13 and 14 have the same shape and connect in the same manner as in FIG. 3. The conducting bars 15a, 15b, and 15c have a different shape from the conducting bars illustrated in FIG. 3, but connect in the same manner as the conducting bars illustrated in FIG. 3.

In the partial cross-sectional view of the connector case of FIG. 5, in the control unit 4 on the inner side of the connector case 3b, an intermediate member 28 is mounted to the back surface side of the connector case 3b. For ease of description, the intermediate member 28 is arranged with a gap between the intermediate member 28 and the back surface of the connector case 3b, but the gap is not necessary. The conducting bars 12, 13, 14, 15a, 15b, and 15c are formed in the intermediate member 28 by insert molding or outsert molding. Therefore, the intermediate member 28 is a nonconductive member made from a plastic resin, for example. The intermediate member 28 may be formed into a desired shape suitable for a holding portion of the terminals (5, 6, and 7), the through hole (TH), the terminal portions of the conducting bars 12, 13, 14, 15a, 15b, and 15c, and the like. Further, the distal ends of the terminals 5, 6, and 7 of each of the connectors 1, 2a, and 2b pass through the connector case 3b and the through-hole (TH) of the intermediate member 28, and are welded and connected to the terminals of the conducting bars 12, 13, and 14 arranged on the surface of the intermediate member 28 on the side opposite to the connector case 3b. In FIG. 5, the through-hole TH formed in the connector case 3b and the intermediate member 28 for the terminal 6 is representatively indicated.

Further, similarly to the first embodiment, the transformer 22 and the coil 24, which are comparatively large-sized circuit components, are mounted from the external side of the connector case 3b. The terminals of the transformer 22 and the coil 24 pass through and extend until the inner side of the connector case 3b and the intermediate member 28, and are welded and connected to the terminals of the conducting bars 13, 14, 15a, 15b, and 15c arranged on the surface of the intermediate member 28 on the side opposite to the connector case 3b. The circuit components mounted from the external side of the connector case 3 are covered by each of the covers 26 and 27 of the circuit components. Note that, in FIG. 5, the through-hole TH formed in the connector case 3b and the intermediate member 28 for the transformer 22 is representatively indicated by the dotted line.

On the other hand, the electrolytic capacitors 21a and 21b and the film capacitors 23a and 23b, which are comparatively small-sized circuit components, are mounted to the intermediate member 28 from the inner side, and the terminals of the electrolytic capacitors 21a and 21b and the film capacitors 23a and 23b are electrically connected to the conducting bars 13, 14, 15a, 15b, and 15c. In this case, the circuit components are mounted in two directions, but the terminals are all connected in the same direction, from the inner side of the connector case 3. Thus, the comparatively large-sized circuit components are mounted from the external side of the connector case 3, but conversely the comparatively small-sized circuit components are mounted from the inner side, which enables the size of the electronic control device to be further reduced without the inner and outer circuit components hitting each other even if they overlap.

Further, combinations of the first embodiment and the second embodiment can be easily realized. In other words, combinations in which the positional relationship between the power supply connector 1 and the second power supply terminals 8, 9, and 10 is roughly orthogonal (or orthogonal) or roughly opposite (or opposite), the mounting direction of the circuit components is in one direction or in both directions, and the intermediate member 28 is included or not included, may be freely selected. In addition, among the second power supply terminals 8, 9, and 10, particularly the positive and negative power supply terminals 8 and 9 may be divided and extended toward the control board 40. In other words, for example, the power supply terminals 8 and 9 illustrated in FIG. 2 and FIG. 5 may be electrically connected also to the control board 40 at a midway portion. Still further, the stacking order of the control board 40 and the drive circuits 30a and 30b may be reversed. In such a case, in order to ensure the heat dissipation properties of the drive circuits 30a and 30b, a housing having good heat conduction made from aluminum, for example, is used for the housing 48 (in the case of FIG. 2, the portion below the connector case 3 serves as the aluminum housing 48), and a heat sink member is arranged between the housing 48 and the drive circuits 30a and 30b.

Thus, the size of the electronic control device can be reduced by mounting the circuit components of the power supply circuit unit among the circuit components to a connector case in which a plurality of connectors are arranged, and supplying electric power to the control unit via conducting bars. Further, by arranging the power supply connectors, circuits, and conducting bars apart from the signal connectors, circuits, and conducting bars, there is a benefit from a noise perspective as well.

Note that, the present invention is not limited to each of the above-mentioned embodiments, and needless to say, the present invention includes all the possible combinations of those embodiments.

INDUSTRIAL APPLICABILITY

Note that, the present invention can be applied in many types of electronic control devices.

REFERENCE SIGNS LIST 1 power supply connector, 2a, 2b signal connector, 3, 3b connector case, 3a wall portion, 4 control unit, 5, 6 first power supply terminal, 7 first signal terminal, 8, 9, 10 second power supply terminal, 11 second signal terminal, 12 signal conducting bar, 13, 14, 15a, 15b, 15c power supply conducting bar, 20 power supply circuit unit, 21a, 21b electrolytic capacitor, 22 transformer, 23a, 23b film capacitor, 24 coil, 25 power supply cover, 26 transformer cover, 27 coil cover, 28 intermediate member, 30 drive circuit unit, 30a, 30b drive circuit, 40 control board, 41 CPU, 42 relay member, 43 motor cover, 44 electronic component, 45 terminal, 46 connection terminal, 48 housing, 50 motor, 51 battery, 52 rotor, 53 output shaft, 54 stator, 55 winding, S switching element, TH through-hole.

The invention claimed is:

1. An electronic control device, comprising:
a connector case;
two or more connectors comprising a power supply connector and another connector, the two or more connectors being mounted to an external side of the connector case;
a control unit mounted to an inner side of the connector case; and
a power supply circuit unit comprising circuit components mounted to the external side of the connector case, said circuit components including at least one of a capacitor, transformer or coil,
the power supply connector and the another connector being mounted apart from each other,
the another connector being connected to the control unit by passing through the connector case not via the power supply circuit unit,
the power supply circuit unit comprising power supply conducting bars adjacent to each other on an inner side of the connector case, the power supply conducting bars being connected to the circuit components and the power supply connector by passing through the connector case and also being connected to the control unit.

2. The electronic control device according to claim 1, wherein the power supply circuit unit comprises the power supply conducting bars, the power supply conducting bars comprising a first power supply terminal of the power supply connector and a second power supply terminal to be connected to the control unit, and
wherein the first power supply terminal and the second power supply terminal are arranged on an outer periphery side in the same planar region on the connector case in directions substantially orthogonal to each other, and are arranged apart from the another connector.

3. The electronic control device according to claim 2, wherein the power supply circuit unit is mounted to an external side of the connector case, and
wherein terminals of each of the circuit components in the power supply circuit unit pass through the connector case and are connected to the power supply conducting bars.

4. The electronic control device according to claim 2, wherein among the circuit components in the power supply circuit unit, a first circuit component mounted to the external side of the connector case is larger than a second circuit component mounted to the inner side of the connector case, and
wherein terminals of the first circuit component are connected to the power supply conducting bars by passing through the connector case and terminals of the second circuit component are connected to the power supply conducting bars on the inner side of the connector case.

5. The electronic control device according to claim 1, wherein the power supply circuit unit comprises the power supply conducting bars, the power supply conducting bars comprising a first power supply terminal of the power supply connector and a second power supply terminal connected to the control unit, and
wherein the first power supply terminal and the second power supply terminal are arranged on an outer periphery side in the same planar region on the connector case in directions substantially opposed to each other, and are arranged apart from the another connector.

6. The electronic control device according to claim 5, wherein the power supply circuit unit is mounted to an external side of the connector case, and
wherein terminals of each of the circuit components in the power supply circuit unit pass through the connector case and are connected to the power supply conducting bars.

7. The electronic control device according to claim 5, wherein among the circuit components in the power supply circuit unit, a first circuit component mounted to the external side of the connector case is larger than a second circuit component mounted to the inner side of the connector case, and
wherein terminals of the first circuit component are connected to the power supply conducting bars by passing through the connector case and terminals of the second circuit component are connected to the power supply conducting bars on the inner side of the connector case.

8. The electronic control device according to claim 1, wherein the power supply circuit unit is mounted to an external side of the connector case, and
wherein terminals of each of the circuit components in the power supply circuit unit pass through the connector case and are connected to the power supply conducting bars.

9. The electronic control device according to claim 1, wherein among the circuit components in the power supply circuit unit, a first circuit component mounted to the external side of the connector case is larger than a second circuit component mounted to the inner side of the connector case, and
wherein terminals of the first circuit component are connected to the power supply conducting bars by passing through the connector case and terminals of the second circuit component are connected to the power supply conducting bars on the inner side of the connector case.

10. The electronic control device according to claim 1, further comprising a signal conducting bar for connecting the another connector to the control unit,
wherein the signal conducting bar and the power supply conducting bars are formed in the connector case by insert molding or outsert molding.

11. The electronic control device according to claim 1, further comprising a signal conducting bar for connecting the another connector to the control unit,
wherein the signal conducting bar and the power supply conducting bars are formed in an intermediate member arranged adjacent to the inner side of the connector case by insert molding or outsert molding.

12. The electronic control device according to claim 1, wherein the power supply conducting bars are arranged in the same plane without overlapping.

13. A electric power steering control device, comprising:
the electronic control device of claim 1; and
a motor to be controlled by the electronic control device,
the electric power steering control device being configured to produce steering assistance torque with the motor.

14. A method of manufacturing an electronic control device, the method comprising the steps of:
integrally forming a connector case with a power supply connector and another connector on an external side of the connector case by insert molding or outsert molding so that terminals of the power supply connector and the another connector and conducting bars for connecting the terminals to a power supply circuit unit and a control unit are integrally formed, to thereby form the conducting bars adjacent to each other on an inner side of the connector case;
mounting circuit components of the power supply circuit unit to the external side of the connector case, said circuit components including at least one of a capacitor, transformer or coil, and connecting the circuit components of the power supply circuit unit to the conducting bars by causing the circuit components to pass through the connector case; and
assembling the control unit to the inner side of the connector case by connecting signal conducting bars, and power supply terminals which protrude from power supply bars on the inner side of the connector case, to the control unit.

15. An electronic control device, comprising:
a connector case;
two or more connectors comprising a power supply connector and another connector, the two or more connectors being mounted to an external side of the connector case;
a control unit mounted to an inner side of the connector case; and
a power supply circuit unit comprising circuit components mounted to the external side of the connector case,
the power supply connector and the another connector being mounted apart from each other,
the another connector being connected to the control unit by passing through the connector case not via the power supply circuit unit,
the power supply circuit unit comprising power supply conducting bars adjacent to each other on an inner side of the connector case, the power supply conducting bars being connected to the circuit components and the power supply connector by passing through the connector case and also being connected to the control unit;
wherein among the circuit components in the power supply circuit unit, a first circuit component mounted to the external side of the connector case is larger than a second circuit component mounted to the inner side of the connector case, and
wherein terminals of the first circuit component are connected to the power supply conducting bars by passing through the connector case and terminals of the second circuit component are connected to the power supply conducting bars on the inner side of the connector case.

16. The electronic control device according to claim 15, wherein the power supply circuit unit comprises the power supply conducting bars, the power supply conducting bars comprising a first power supply terminal of the power supply connector and a second power supply terminal to be connected to the control unit, and
wherein the first power supply terminal and the second power supply terminal are arranged on an outer periphery side in the same planar region on the connector case in directions substantially orthogonal to each other, and are arranged apart from the another connector.

17. The electronic control device according to claim 15, wherein the power supply circuit unit comprises the power supply conducting bars, the power supply conducting bars comprising a first power supply terminal of the power supply connector and a second power supply terminal connected to the control unit, and wherein the first power supply terminal and the second power supply terminal are arranged on an outer periphery side in the same planar region on the connector case in directions substantially opposed to each other, and are arranged apart from the another connector.

* * * * *